United States Patent
Sanemasa et al.

(10) Patent No.: US 10,446,432 B2
(45) Date of Patent: Oct. 15, 2019

(54) CONVEYANCE SYSTEM, ROBOT, AND METHOD FOR CONTROLLING ROBOT

(71) Applicant: KABUSHIKI KAISHA YASKAWA DENKI, Kitakyushu-shi (JP)

(72) Inventors: Hiroki Sanemasa, Kitakyushu (JP); Daisuke Shin, Kitakyushu (JP); Hisaya Inoue, Kitakyushu (JP); Ryosuke Watanabe, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 39 days.

(21) Appl. No.: 15/479,215

(22) Filed: Apr. 4, 2017

(65) Prior Publication Data
US 2017/0294334 A1 Oct. 12, 2017

(30) Foreign Application Priority Data
Apr. 8, 2016 (JP) .................. 2016-078274

(51) Int. Cl.
*H01L 21/68* (2006.01)
*H01L 21/687* (2006.01)
*H01L 21/677* (2006.01)

(52) U.S. Cl.
CPC .... *H01L 21/68707* (2013.01); *H01L 21/6773* (2013.01); *H01L 21/67715* (2013.01); *H01L 21/67766* (2013.01)

(58) Field of Classification Search
CPC ........... H01L 21/67715; H01L 21/6773; H01L 21/67766; H01L 21/68707

(Continued)

(56) References Cited

U.S. PATENT DOCUMENTS 6,517,304 B1 * 2/2003 Matsumoto ....... H01L 21/67748
414/217
2005/0011294 A1 1/2005 Hashimoto et al.
(Continued)

FOREIGN PATENT DOCUMENTS

JP 2005-39047 2/2005
JP 2009-503811 1/2009
(Continued)

OTHER PUBLICATIONS

Japanese Office Action for corresponding JP Application No. 2016-078274, dated Oct. 16, 2018 (w/ English machine translation).

*Primary Examiner* — Ronald P Jarrett
(74) *Attorney, Agent, or Firm* — Mori & Ward, LLP

(57) ABSTRACT

A conveyance system includes a conveyance chamber including a second side wall opposite to a first side wall in a depth direction of the conveyance chamber. A robot is disposed in the conveyance chamber. The robot includes a body, a first arm, a second aim, and a hand. The body is disposed between the second side wall and a reference position in the depth direction. A second leading end of the second arm is positioned between a restricted position and the reference position in the depth direction when a first inter-axis direction and a second inter-axis direction are substantially perpendicular to the first side wall. A controller is connected to the robot to control the robot to limit entrance into an area between the first side wall and the restricted position in the depth direction.

16 Claims, 12 Drawing Sheets

(58) Field of Classification Search
USPC .......................................... 414/222.13, 744.5
See application file for complete search history.

(56) References Cited

U.S. PATENT DOCUMENTS

| | | | |
|---|---|---|---|
| 2007/0020082 A1* | 1/2007 | Caveney | B25J 9/042 |
| | | | 414/744.5 |
| 2013/0195584 A1 | 8/2013 | Furuichi et al. | |
| 2013/0195601 A1* | 8/2013 | Shin | B25J 9/02 |
| | | | 414/744.5 |
| 2014/0205416 A1 | 7/2014 | Hosek et al. | |
| 2014/0221534 A1 | 8/2014 | Osborne, Jr. | |
| 2014/0261168 A1* | 9/2014 | Liang | H01L 21/6719 |
| | | | 118/500 |
| 2015/0352714 A1 | 12/2015 | Hosek et al. | |
| 2015/0352729 A1 | 12/2015 | Hosek et al. | |
| 2016/0167229 A1 | 6/2016 | Hosek | |
| 2018/0056509 A1 | 3/2018 | Hosek et al. | |
| 2018/0108561 A1 | 4/2018 | Hosek | |

FOREIGN PATENT DOCUMENTS

| | | |
|---|---|---|
| JP | 2013-154453 | 8/2013 |
| JP | 2016-505219 | 2/2016 |

* cited by examiner

CONVEYANCE SYSTEM, ROBOT, AND METHOD FOR CONTROLLING ROBOT

CROSS-REFERENCE TO RELATED APPLICATIONS

The present application claims priority under 35 U.S.C. § 119 to Japanese Patent Application No. 2016-078274, filed Apr. 8, 2016. The contents of this application are incorporated herein by reference in their entirety.

BACKGROUND

Field of the Invention

The embodiments disclosed herein relate to a conveyance system, a robot, and a method for controlling a robot.

Discussion of the Background

Japanese Unexamined Patent Application Publication No. 2005-039047 and Japanese Translation of PCT International Application Publication No. JP-T-2009-503811 disclose conveyance systems each including a robot, a locally cleaned conveyance chamber, and a substrate storage cassette or a processing chamber. The robot is a horizontal multi-articular robot with a hand to hold substrates and is located in the conveyance chamber. The substrate storage cassette or the processing chamber is located on a side wall of the conveyance chamber. The robot conveys substrates to the substrate storage cassette or the processing chamber.

For greater efficiency in substrate conveyance, as many cassettes as possible are preferably located on the side wall of the conveyance chamber. For a smaller footprint in the conveyance chamber, the depth of the conveyance chamber (the distance between the front wall, on which the cassettes are located, and the back wall of the conveyance chamber) is preferably as small as possible.

In an attempt to meet these demands, Japanese Unexamined Patent Application Publication No. 2005-039047 increases the number of the links of the robot from three to four, and Japanese Translation of PCT International Application Publication No. JP-T-2009-503811 makes the lengths of the links of the robot (the distances between the rotation axes) unequal.

SUMMARY

According to one aspect of the present disclosure, a conveyance system includes a conveyance chamber, a robot, and a controller. The conveyance chamber includes a first side wall and a second side wall. At least one cassette to contain at least one substrate is disposed on a side of the first side wall outside of the conveyance chamber. The second side wall is opposite to the first side wall in a depth direction of the conveyance chamber. The robot is disposed in the conveyance chamber. The robot includes a body, a first arm, a second arm, and a hand. The first arm includes a first base end and a first leading end. The first base end is connected to the body rotatably around a first rotation axis. The first leading end is opposite to the first base end. The second arm includes a second base end and a second leading end. The second base end is connected to the first leading end of the first arm rotatably around a second rotation axis. The first arm has a first inter-axis distance between the first rotational axis and the second rotational axis in a first inter-axis direction. The second leading end is opposite to the second base end. The hand is to hold the substrate. The hand includes a hand base end connected to the second leading end of the second arm rotatably around a third rotation axis. The second arm has a second inter-axis distance between the second rotation axis and the third rotation axis in a second inter-axis direction. The second inter-axis distance is longer than a first inter-axis distance. The second leading end is positioned between a restricted position and the reference position in the depth direction when the first inter-axis direction and the second inter-axis direction are substantially perpendicular to the first side wall. The controller is connected to the robot to control the robot to limit entrance into an area between the first side wall and the restricted position in the depth direction.

According to another aspect of the present disclosure, a robot includes a body, a first arm, a second arm, and a hand. The first arm includes a first base end and a first leading end. The first base end is connected to the body rotatably around a first rotation axis. The first leading end is opposite to the first base end. The second arm includes a second base end and a second leading end. The second base end is connected to the first leading end of the first arm rotatably around a second rotation axis. The first arm has a first inter-axis distance between the first rotational axis and the second rotational axis in a first inter-axis direction. The second leading end is opposite to the second base end. The hand is to hold a substrate and includes a hand base end connected to the second leading end of the second arm rotatably around a third rotation axis. The second inter-axis distance is longer than the first inter-axis distance. The second leading end is positioned between a restricted position and the reference position in the depth direction when the first inter-axis direction and the second inter-axis direction are substantially perpendicular to the first side wall. The robot is controlled by a controller connected to the robot to limit entrance into an area between the first side wall and the restricted position in the depth direction.

According to further aspect of the present disclosure, a method for controlling a robot includes storing a link length difference between a first inter-axis distance of a first arm and a second inter-axis distance of a second arm. The first arm is connected to a body of the robot rotatably around a first rotation axis. The second arm is connected to the first arm rotatably around a second rotation axis. A hand to hold a substrate is connected to the second arm rotatably around a third rotation axis. The first inter-axis distance is a distance between the first rotation axis and the second rotation axis in a first inter-axis direction. The second inter-axis distance is a distance between the second rotation axis and the third rotation axis. The robot is controlled to convey the substrate along a tangent on a circle having a center at the first rotation axis and having a radius approximately equal to the link length difference.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
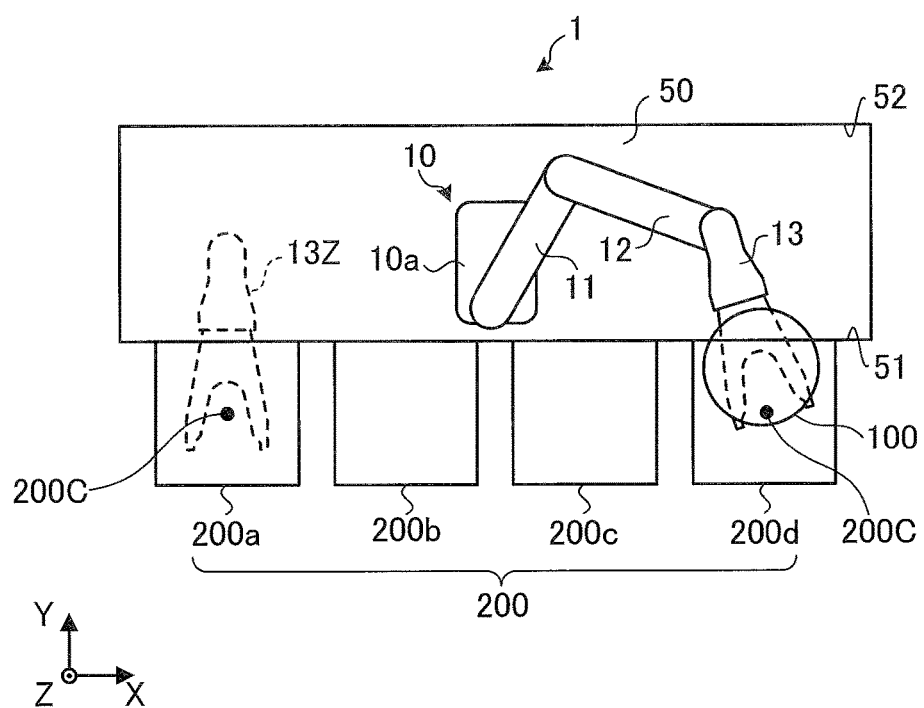
FIG. 1 is a top view of a conveyance system schematically illustrating its configuration.

The embodiments will now be described with reference to the accompanying drawings, wherein like reference numerals designate corresponding or identical elements throughout the various drawings.

It is noted that the following embodiments are provided for exemplary purposes only and are not intended in a limiting sense.

In the following description, the terms "parallel", "perpendicular", "vertical", "front", "center", and "overlap" may occasionally be used to not only mean "parallel", "perpendicular", "vertical", "front", "center", and "overlap", respectively, in a strict sense but also mean "parallel", "perpendicular", "vertical", "front", "center", and "overlap", respectively, in an approximate sense. That is, these terms are used taking into consideration production-related, installation-related, processing-related, and detection-related tolerances and errors.

A conveyance system 1 according to this embodiment will be outlined by referring to FIG. 1. FIG. 1 is a top view of the conveyance system 1 schematically illustrating its configuration. For ease of description, FIG. 1 illustrates a three-dimensional orthogonal coordinate system including: a Z axis with its vertically upward direction being assumed the positive direction; an X axis along the longer side of a conveyance chamber 50; and a Y axis along the shorter side of the conveyance chamber 50. This orthogonal coordinate system may also be illustrated in some other drawings referred to in the following description.

As illustrated in FIG. 1, the conveyance system 1 includes the conveyance chamber 50, a robot 10, and a plurality of cassettes 200. The conveyance chamber 50 is what is called an Equipment Front End Module (EFEM), which is a locally cleaned housing in which clean air flows downward.

In FIG. 1, the conveyance chamber 50 has a rectangular shape with its longer side oriented in the X axis direction, and has a first side wall 51, which is the front surface of the conveyance chamber 50. Along the first side wall 51, the plurality of cassettes 200 are aligned with each other. The conveyance chamber 50 also has a second side wall 52, which is the back surface of the conveyance chamber 50. In some applications, a processing chamber in which substrates 100 are processed is provided on the second side wall 52, on any of the shorter sides (which are along the Y axis illustrated in FIG. 1) of the conveyance chamber 50, or on the inner surface of any of the shorter sides. In FIG. 1, the processing chamber is not illustrated.

The positions, sizes, and intervals of the openings provided on the first side wall 51 to accept the cassettes 200 are compliant with SEMI (Semiconductor Equipment and Materials International) standards. The dimensions of each cassette 200 are also compliant with SEMI standards.

The robot 10 is disposed in the conveyance chamber 50, and is what is called a three-link horizontal multi-articular robot that includes a body 10a, a first arm 11, a second arm 12, and a hand 13. A configuration of the robot 10 and a configuration of the hand 13 will be described in detail later by referring to FIGS. 2 and 3. The robot 10 holds a substrate 100 by the hand 13 and conveys the substrate 100 to various destinations such as the cassettes 200.

Each cassette 200 is what is called a Front-Opening Unified Pod (FOUP) and has multiple levels to store the substrates 100. In the cassette 200, each substrate 100 has its reference position (for example, center) match a conveyance position 200C illustrated in FIG. 1.

As illustrated in FIG. 1, the cassettes 200 are aligned with each other along the first side wall 51 of the conveyance chamber 50. In FIG. 1, the cassettes 200 on the conveyance chamber 50 include a cassette 200a, a cassette 200b, a cassette 200c, and a cassette 200d.

When the cassettes 200 come in even number, as in this embodiment, the robot 10 is located at or in the vicinity of the center of the series of cassettes 200, that is, between the cassette 200b and the cassette 200c so as to enhance accessibility of the cassettes 200.

The robot 10 is closer to the first side wall 51 than to the second side wall 52, in the Y axis direction. This configuration is for the purpose of minimizing the depth of the conveyance chamber 50 (the dimension along the Y axis illustrated in FIG. 1), in other words, making the links (such as the first arm 11) as long as possible while keeping the links out of contact with the second side wall 52.

When robots are used to convey substrates to cassettes, common practice is to position the hand perpendicular to the first side wall 51, that is, to the front surface of the cassette, in conveying substrate to the cassette (this practice will be hereinafter referred to as "perpendicular conveyance").

In some applications, such as the embodiment of FIG. 1, the perpendicular conveyance is difficult to perform. For example, in the embodiment of FIG. 1, when the robot 10 conveys substrates 100 to the cassettes 200a and 200d, which are farthest from the robot 10, it is difficult position the hand 13 perpendicular to the first side wall 51 even by stretching out the first arm 11 and the second arm 12.

In order for the robot 10 to approach the cassettes 200a and 200d with the hand 13 perpendicular to the first side wall 51, it is necessary to increase the number of the links. Increasing the number of the links, however, increases costs involved in the manufacture of the robot 10.

In light of this situation, the conveyance system 1 according to this embodiment makes substrates 100 enter the cassettes 200a and 200d with the hand base end of the hand 13 inclined toward the robot 10, as illustrated in FIG. 1. Then, the robot 10 conveys a substrate 100 to the conveyance position 200C while turning the hand 13 to make the hand 13 perpendicular to the first side wall 51 (hereinafter referred to as "inclination conveyance").

For reference purposes, the posture that the hand 13 is taking when the substrate 100 has reached the conveyance position 200C is indicated as posture 13Z by broken lines in the cassette 200a. While the hand 13 is taking the posture 13Z, the hand 13 is approximately perpendicular to the first side wall 51.

In order to make the lengths of the links (the first arm 11, the second arm 12, and the hand 13) as long as possible in the conveyance system 1 according to this embodiment, the body 10a of the robot 10 takes a unique position with a unique arrangement of the turning axes of the links. This will be described in detail later by referring to FIG. 4.

Because of the unique position of the robot 10 and the unique arrangement of the turning axes, the conveyance system 1 is able to convey substrates 100 to the four cassettes 200 using the single robot 10. Additionally, there is no need for a traveling axis in the X axis direction in the conveyance system 1; installing the single robot 10 in the conveyance chamber 50 suffices.

Thus, the conveyance system 1 improves conveyance efficiency without increase in costs. Additionally, eliminating the need for a traveling axis increases the degree of cleanliness of the inside of the conveyance chamber 50.

When the robot 10 conveys a substrate 100 to the cassettes 200b and 200c, that is, when the robot 10 conveys a substrate 100 to the cassettes 200 other than the farthest cassettes 200a and 200d, the hand 13 takes a position perpendicular to the first side wall 51 and makes the substrate 100 enter the cassette 200b or 200c. Then, with the hand 13 keeping this perpendicular posture, the hand 13 moves the substrate 100 to the conveyance position 200C. Thus, the conveyance system 1 performs the above-described perpendicular conveyance.

While in FIG. 1 the farthest cassettes 200a and 200d are at approximately equal distances from the robot 10, the farthest cassettes 200a and 200d may be at different distances from the robot 10 in another embodiment. In the case of different distances, the above-described inclination conveyance may be used for either the cassette 200a or the cassette 200d that is farther from the robot 10.

For example, in a possible embodiment, four cassettes 200, namely, cassettes 200a, 200b, 200c, and 200d are aligned on the conveyance chamber 50, and the robot 10 is installed at a position facing the front surface of the cassette 200c, which is the second cassette 200 next to one farthest cassette 200d. In this case, the robot 10 may perform the inclination conveyance with respect to the other farthest cassette 200a.

In another possible embodiment, three cassettes 200, namely, cassettes 200b, 200c, and 200d are aligned on the conveyance chamber 50, and the robot 10 is installed at a position facing the front surface of the cassette 200c, which is the center cassette 200. In this case, the robot 10 may perform the inclination conveyance with respect to the farthest cassettes 200b and 200d.

The target of the inclination conveyance will not be limited to the farthest cassettes 200; it is possible to determine any other cassettes 200 as the target based on the target's distance from the robot 10. That is, the cassettes 200 other than the farthest cassettes 200 may be targeted for the inclination conveyance.

For example, it is possible to perform the inclination conveyance with respect to the cassettes 200b and 200c illustrated in FIG. 1. When the number of the cassettes 200 is other than four, unlike the embodiment of FIG. 1, any of the cassettes 200 may be targeted for the inclination conveyance. No matter how many cassettes 200 are provided, the shorter side length of the common conveyance chamber 50 remains unchanged, and the common robot 10 remains unchanged.

While in FIG. 1 the inclination conveyance is performed with respect to the farthest cassettes 200a and 200d, it is possible to perform the perpendicular conveyance with respect to the farthest cassettes 200a and 200d if there is enough room in the depth of the conveyance chamber 50 (the dimension along the Y axis illustrated in FIG. 1).

Figure 2:
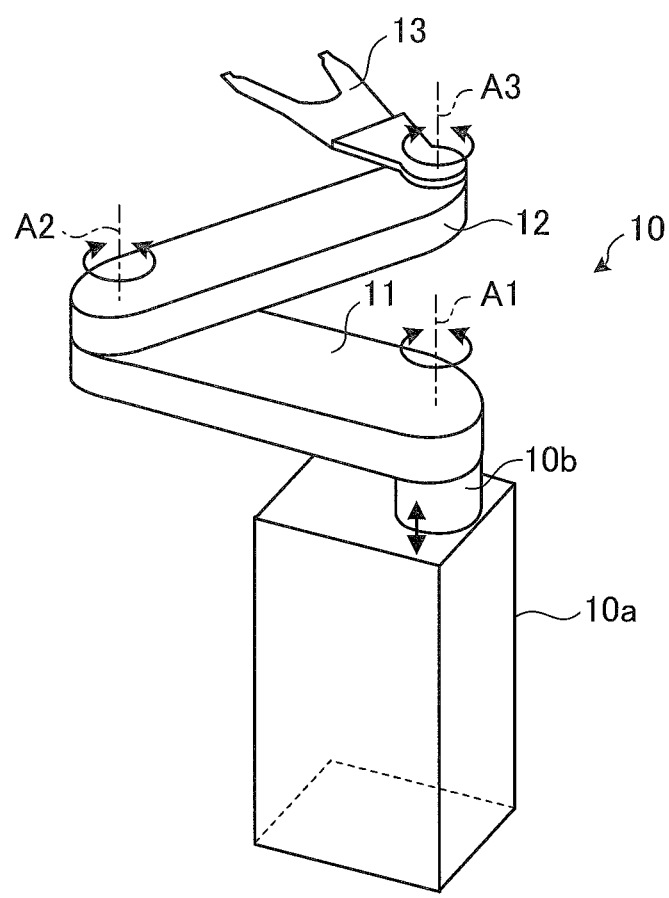
FIG. 2 is a perspective view of a robot.

A configuration of the robot 10 will be described by referring to FIG. 2. FIG. 2 is a perspective view of the robot 10. As illustrated in FIG. 2, the robot 10 includes the body 10a, a lift shaft 10b, the first arm 11, the second arm 12, and the hand 13.

While in FIG. 2 the robot 10 has a single hand 13, the robot 10 may have two or more hands 13. When the robot 10 has two or more hands 13, the same number of turning mechanisms as the number of the hands 13 may be provided that are coaxial to a third axis A3 and turnable independently of each other.

The body 10a is hung on a side surface of the conveyance chamber 50 (which is illustrated in FIG. 1), and includes a lift mechanism (not illustrated) that lifts the lift shaft 10b up and down. When the body 10a is "hung on" a surface, it is intended to mean that instead of being "placed on the bottom", the body 10a is fixed to a wall or a support standing on the bottom and is not in contact with the floor.

The lift shaft 10b supports the first base end of the first aim 11 while ensuring that the first base end is turnable about a first axis A1. The lift shaft 10b is capable of lifting itself up and down along the first axis A1. In a possible embodiment, the lift shaft 10b itself may be turnable about the first axis A1. In another possible embodiment, the first axis A1 may be displaced in the Y axis negative direction, which is opposite to the Y axis (positive) direction, on the upper surface of the lift shaft 10b. This is because if the first axis A1 is displaced in the Y axis negative direction, a longer first arm 11 can be used.

The first arm 11 supports, at its leading end, the second base end of the second arm 12 while ensuring that the second base end is turnable about a second axis A2. The second arm 12 supports, at its leading end, the hand base end of the hand 13 while ensuring that the hand base end is turnable about the third axis A3.

Thus, the robot 10 is a horizontal multi-articular robot with three links, namely, the first arm 11, the second arm 12, and the hand 13. Since the robot 10 is equipped with a lift mechanism, as described above, the robot 10 has access to the multiple levels of substrates 100 in each cassette 200.

The robot 10 also has access to a processing chamber 300 and an aligner 310. The processing chamber 300 is at a height different from the height of the cassettes 200 (see FIG. 8A). The aligner 310 adjusts the orientation of the substrate 100 (see FIG. 8B).

Figure 3:
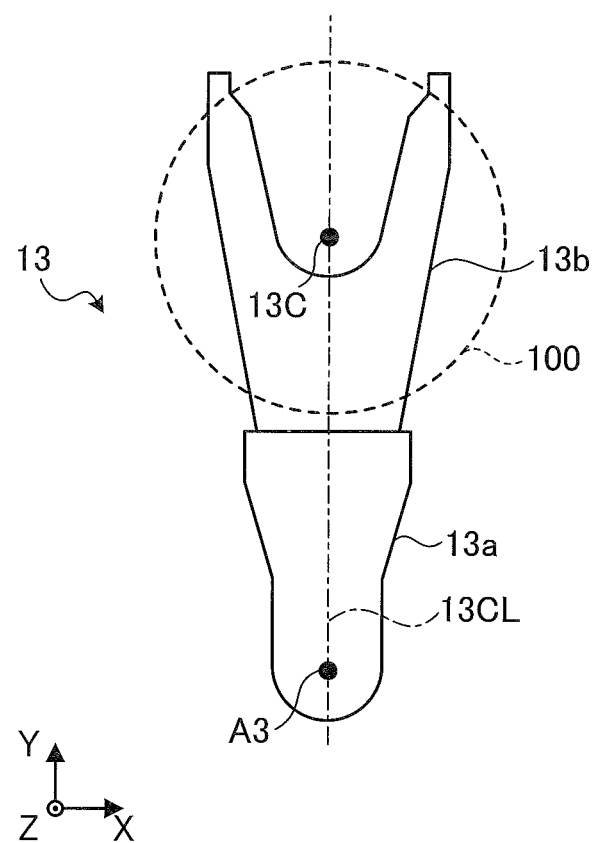
FIG. 3 is a top view of a hand.

A configuration of the hand 13 will be described in more detail by referring to FIG. 3. FIG. 3 is a top view of the hand 13. As illustrated in FIG. 3, the hand 13 includes a hand base 13a and a fork 13b. The base end of the hand base 13a is supported by the second arm 12 (see FIG. 2) while being turnable about the third axis A3. The fork 13b is located on the leading end of the hand base 13a and has a furcate shape at the leading end of the fork 13b.

Also as illustrated in FIG. 3, 13C is the reference position of the hand 13 corresponding to the reference position (for example, center) of the substrate 100 held by the hand 13. 13CL is a center line connecting the third axis A3 and the reference position 13C to each other, and indicates the orientation of the hand 13. A configuration not illustrated in FIG. 3 is that the hand 13 includes a grasping mechanism to grasp substrates 100. In another possible embodiment, the hand 13 may have another type of holding mechanism such as a suction mechanism.

Figure 4:
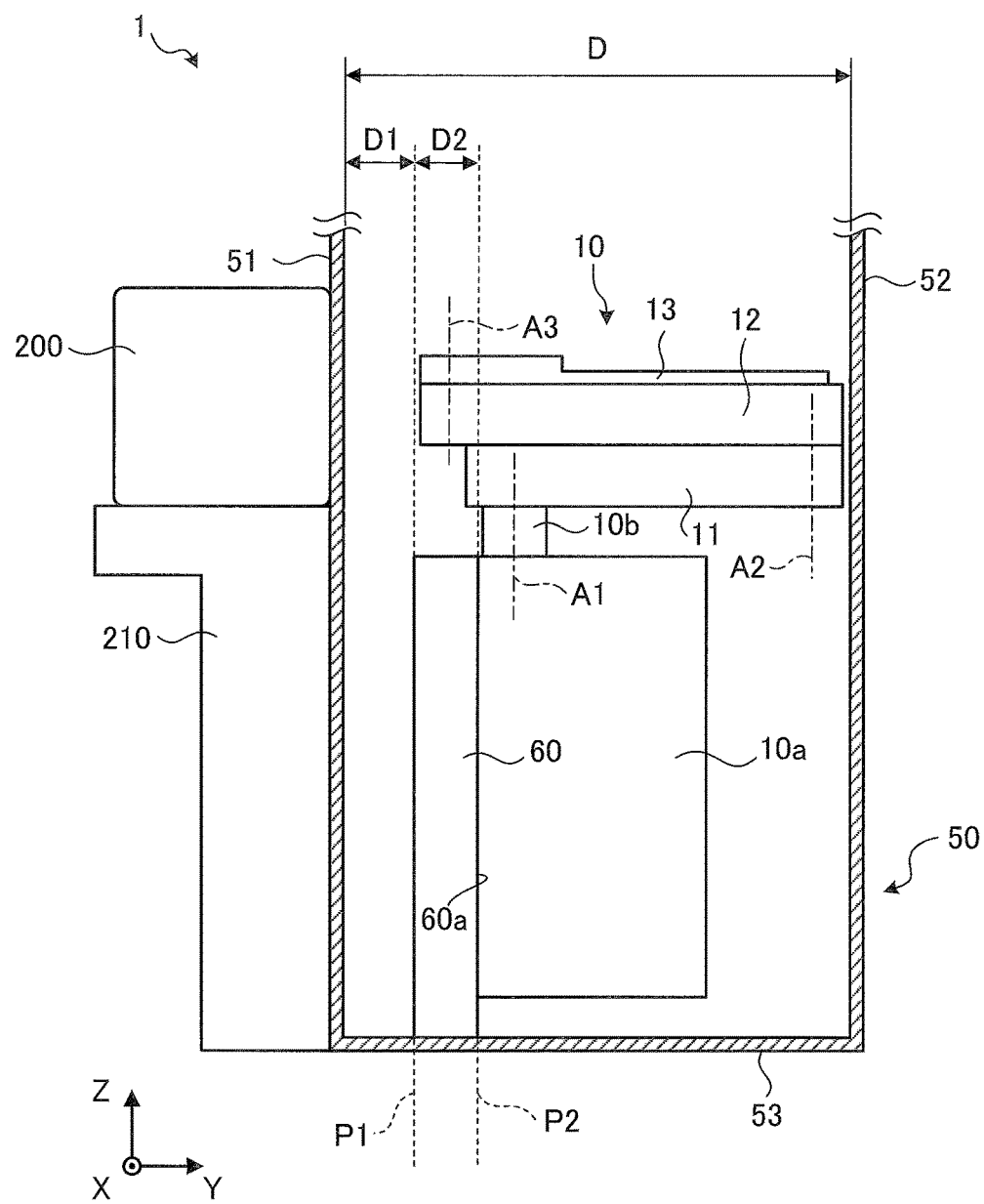
FIG. 4 is a side view of a conveyance chamber illustrating where the robot is arranged.

An arrangement of the body 10a, the first axis A1, the second axis A2, and the third axis A3 in the robot 10 will be described by referring to FIG. 4. FIG. 4 is a side view of the conveyance system 1 illustrating where the robot 10 is arranged. The side view illustrated in FIG. 4 is a view of the conveyance chamber 50 illustrated in FIG. 1 as seen from the X axis positive direction illustrated in FIG. 1.

Also in FIG. 4, the robot 10 is taking such a posture that the first arm 11 and the second aim 12 overlap each other and are approximately perpendicular to the first side wall 51 (this posture will be hereinafter referred to as "normal posture"). While in FIG. 4 the hand 13 overlaps the second arm 12 and is approximately perpendicular to the first side wall 51, the hand 13's being approximately perpendicular to the first side wall 51 is not essential in the "normal posture".

As illustrated in FIG. 4, D denotes the depth of the conveyance chamber 50. Specifically, the depth D is defined as the distance inside the conveyance chamber 50 between the inner surface of the first side wall 51 and the inner surface of the second side wall 52. P1 is a restricted position defined at a first distance D1 from the inner surface of the first side wall 51 toward the second side wall 52. The restricted position P1 is compliant with SEMI standards, and the robot 10 passing beyond the restricted position P1 is limited. P2 is a reference position defined at a second distance D2 from the restricted position P1 toward the second side wall 52. The reference position P2 serves as a basis for the installment position at which the robot 10 is installed.

In this embodiment, the first distance D1 is 100 millimeters (mm) As described above, the spatial intervals and other parameters of the cassettes 200 are determined in compliance with SEMI standards. In order to ensure the conveyance of substrates 100 (see FIG. 1) to farther cassettes 200 under the SEMI conditions, the robot 10 is located at a position as close as possible to the first side wall 51, on which the cassettes 200 are disposed. That is, the second distance D2 is as short as possible. For example, the second distance D2 is shorter than the first distance D1 or shorter than half the first distance D1. This configuration makes the link lengths of the first arm 11 and the second arm 12 as large as possible, ensuring enough installment space for the body 10a.

The region between the inner surface of the first side wall 51 and the restricted position P1 is room for the cassettes 200 to be opened and closed. At the reference position P2, a reference plate 60 is located. The reference plate 60 has a reference surface 60a. The reference surface 60a is approximately parallel to X-Z plane illustrated in FIG. 4. The reference plate 60 has its lower surface fixed to the bottom, 53, of the conveyance chamber 50. That is, the reference plate 60 is supported by the bottom 53 of the conveyance chamber 50.

As described above, the reference surface 60a of the reference plate 60 is approximately parallel to the X-Y plane illustrated in FIG. 4. In other words, in order to ensure precise verticality of the reference surface 60a, the reference surface 60a is fixed to the bottom 53 of the conveyance chamber 50.

As illustrated in FIG. 4, the body 10a of the robot 10 is hung on and fixed to the reference plate 60 with a side surface of the body 10a mounted on the reference surface 60a. Specifically, the body 10a is located at the reference position P2 as a result of the body 10a being brought into contact with the reference position P2 from the side of the second side wall 52. In other words, the body 10a is located on the side of the second side wall 52 relative to the reference position P2.

Thus, the robot 10 is fixed to the reference plate 60. This configuration ensures accuracy in determining the position and posture of the robot 10, improving the efficiency of the installment work of the robot 10. The opposite surface of the reference plate 60 opposite to the reference surface 60a is located between the restricted position P1 and the reference position P2. In FIG. 4, the opposite surface of the reference plate 60 is located in the restricted position P1. The reference plate 60 may not necessarily be a single plate; other examples of the form of the reference plate 60 include, but are not limited to, a hollow structure and a combination of a plurality of members.

With the first arm 11 lifted down to its lowest position, the upper surface of the reference plate 60 is lower in height than the lower surface of the first arm 11. This configuration prevents the reference plate 60 from obstructing the upward and downward movements of the first arm 11, expanding the range over which the first arm 11 is able to lift up and down.

While in FIG. 4 the height of the upper surface of the reference plate 60 is approximately the same as the height of the upper surface of the body 10a, the height of the upper surface of the reference plate 60 may be lower than the height of the upper surface of the body 10a. On condition that the height of the upper surface of the reference plate 60 is lower than the height of the lower surface of the first arm 11 at its lowest position, the height of the upper surface of the reference plate 60 may be greater than the height of the upper surface of the body 10a.

As illustrated in FIG. 4, the lift shaft 10b of the robot 10 is as close to the reference position P2 as possible on the upper surface of the body 10a. The first axis A1 is also as close to the reference position P2 as possible. When one element is "as close to another element as possible", it is intended to mean that the one element is close to but not in contact with the other element while securing design-error tolerance and manufacturing-error tolerance.

The first base end of the first arm 11 is located above the reference plate 60, that is, located between the restricted position P1 and the reference position P2. The first arm 11 has such a turnable range about the first axis A1 that the first leading end of the first arm 11 enters the space between the restricted position P1 and the reference position P2. The second axis A2 is as close to the inner surface of the second side wall 52 as possible.

The second leading end of the second arm 12 is located between the restricted position P1 and the reference position P2. More specifically, the second leading end of the second aim 12 is as close to the restricted position P1 as possible. The third axis A3 is also located between the restricted position P1 and the reference position P2.

While in FIG. 4 the first axis A1 is located approximately at the center of the dimension of the lift shaft 10b in the Y axis direction, the first axis A1 may be displaced toward the reference position P2 within the lift shaft 10b. While in FIG. 4 the robot 10 is hung on the reference plate 60, the robot 10 may be placed on the bottom 53 of the conveyance chamber 50. The configuration in which the robot 10 is placed on the bottom 53 of the conveyance chamber 50 will be described later by referring to FIG. 11.

As illustrated in FIG. 4, some of the dimensions of the robot 10 are determined based on the normal posture of the robot 10. Specifically, some of the dimensions of the robot 10 are determined such that the order in which some elements of the robot 10 are identified by a view in the direction from the first side wall 51 toward the second side wall 52 of the conveyance chamber 50 is the restricted position P1, the second leading end of the second arm 12, the third axis A3, the first base end of the first arm 11, the reference position P2, the first axis A1, the second axis A2, and the first leading end of the first arm 11.

This configuration makes the first arm 11 and the second arm 12 of the robot 10 as long as possible, enabling the single robot 10 to convey substrates 100 (see FIG. 1) to all the cassettes 200, even if there are as many as four cassettes 200 as in FIG. 1. That is, the robot 10 is capable of conveying a substrate 100 held by the hand 13 to the conveyance position 200C of every cassette 200.

The first axis A1 is as close to the reference position P2 as possible, and the second axis A2 is as close to the inner surface of the second side wall 52 as possible. This configuration makes the first arm 11 as long as possible. Also, the third axis A3 is as close to the restricted position P1 as possible. This configuration makes the second arm 12 as long as possible. The lengths of the first arm 11, the second arm 12, and the hand 13 will be described in detail later by referring to FIG. 5.

As illustrated in FIG. 4, the third axis A3 is closer to the restricted position P1 than the first base end of the first arm 11 is to the restricted position P1. This configuration, however, is not intended in a limiting sense. In another possible embodiment, the first arm 11 may be elongated so that the first base end becomes closer to the restricted position P1 and overlaps the third axis A3. In still another possible embodiment, the first arm 11 may be elongated so that the first base end becomes closer to the restricted position P1 than the third axis A3 is to the restricted position P1.

Figure 5:
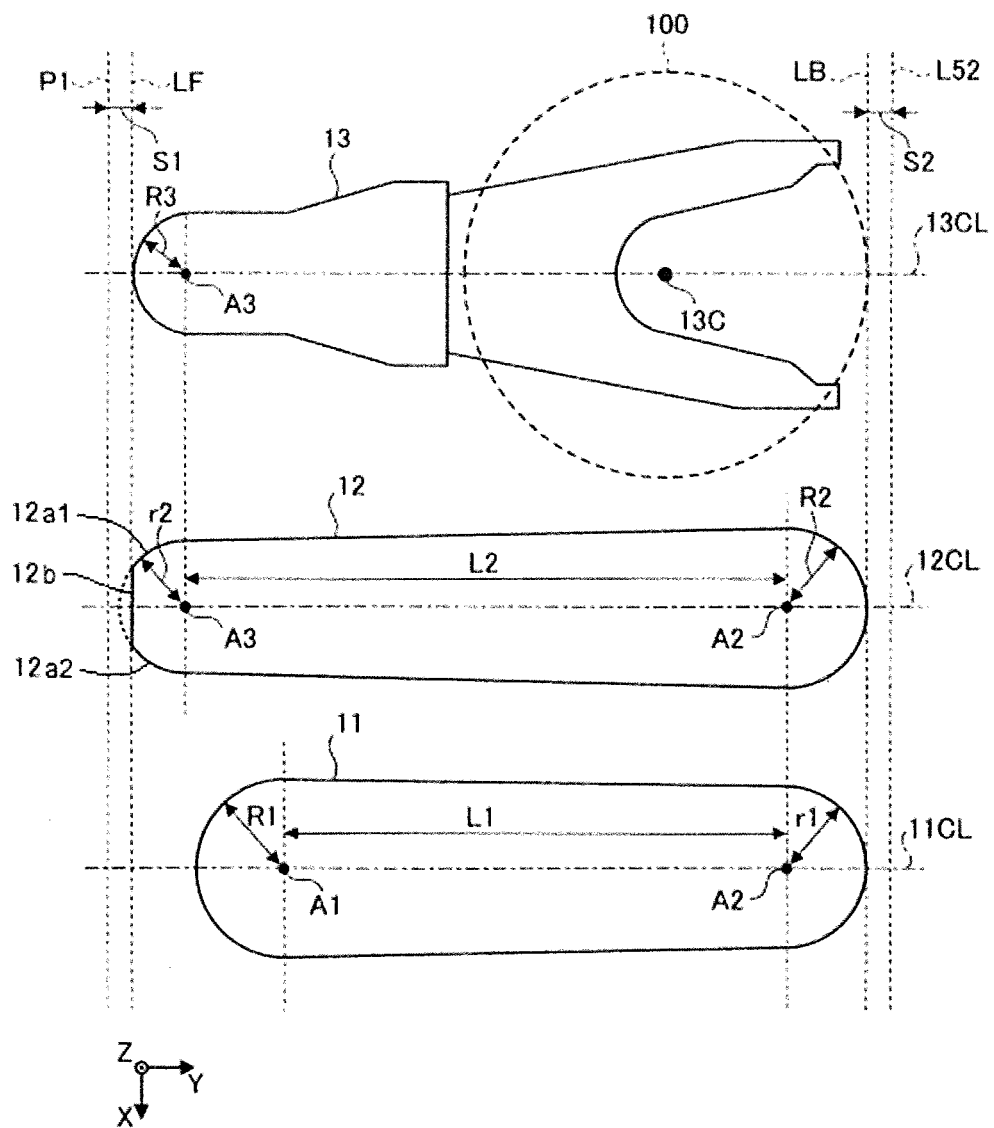
FIG. 5 is a top view of the links of the robot illustrating the lengths of the links in comparison with each other.

The lengths of the first arm 11, the second arm 12, and the hand 13 will be described in detail by referring to FIG. 5. FIG. 5 is a top view of the links of the robot 10 illustrating the lengths of the links in comparison with each other. In FIG. 5, for ease of comparison of the lengths of the first arm 11, the second arm 12, and the hand 13, these links are aligned in the X axis direction, while the positions of these links relative to each other are the same as the positions that the links take when the robot 10 takes the posture that the first arm 11, the second arm 12, and the hand 13 overlap each other and are approximately perpendicular to the first side wall 51 (see FIG. 1).

While in FIG. 5 the outer shapes of the first arm 11, the second arm 12, and the hand 13 are simplified, the outer shapes may have necessary depressions and/or protrusions in actual applications.

First, the first arm 11 will be described. As illustrated in FIG. 5, the first axis A1 and the second axis A2 pass through the first arm 11. The first axis A1 is the turning axis of the first arm 11, and the second axis A2 is the turning axis of the second arm 12. The distance between two axes is generally referred to as inter-axis distance. In the following description, the inter-axis distance of the first arm 11 (between the first axis A1 and the second axis A2) will be referred to as first link length L1. The first link length L1 has a magnitude of "L1".

As illustrated in FIG. 5, a center line 11CL passes through the first axis A1 and the second axis A2. When the first arm 11 is approximately perpendicular to the first side wall 51 (see FIG. 1), the center line 11CL is approximately parallel to the Y axis illustrated in FIG. 5. The first leading end of the first arm 11 is positioned at LB. With the first leading end at the position LB, the second base end of the second arm 12 and the leading end of the substrate 100 held by the hand 13 are at the position LB or at a position further in the Y axis negative direction than the position LB.

As illustrated in FIG. 5, the first base end of the first arm 11 has an arcuate shape that is centered about the first axis A1 and that has a radius of "R1". Also as illustrated in FIG. 5, the first leading end of the first arm 11 has an arcuate shape that is centered about the second axis A2 and that has a radius of "r1".

Using these parameters, the length "AL1" of the first arm 11 can be represented by the following Formula (1):

$$AL1 = R1 + L1 + r1$$

The second arm 12 will be described. As illustrated in FIG. 5, the second axis A2 and the third axis A3 pass through the second arm 12. The second axis A2 is the turning axis of the second arm 12, and the third axis A3 is the turning axis of the hand 13. As illustrated in FIG. 5, the inter-axis distance between the second axis A2 and the third axis A3 will be referred to as second link length L2. The second link length L2 has a magnitude of "L2". FIG. 5 shows that the second link length L2 is greater than the first link length L1 of the first arm 11 (L2>L1).

As illustrated in FIG. 5, a center line 12CL passes through the second axis A2 and the third axis A3. When the second arm 12 is approximately perpendicular to the first side wall 51 (see FIG. 1), the center line 12CL is approximately parallel to the Y axis illustrated in FIG. 5.

As illustrated in FIG. 5, the second base end of the second arm 12 has an arcuate shape that is centered about the second axis A2 and that has a radius of "R2". The second leading end of the second arm 12 basically has an arcuate shape that is centered about the third axis A3 and that has a radius of "r2". Also as illustrated in FIG. 5, the hand base end of the hand 13 has an arcuate shape that is centered about the third axis A3 and that has a radius of "R3" (R3<r2).

The second leading end of the second arm 12 has a plane surface that is aligned with the hand base end of the hand 13 and that is approximately parallel to the X-Z plane. The plane surface looks as if it has been obtained by cutting an arc (the plane surface will be hereinafter referred to as "D cut"). In other words, the second arm 12 has a first curved side surface 12a1, a plane surface 12b, and a second curved surface 12a2. The plane surface 12b is located at the second leading end (which is located on the negative side of the Y axis direction) of the second arm 12, and connects the curved side surfaces 12a1 and 12a2 to each other. This configuration makes the second link length L2 of the second arm 12 as long as possible.

Using these parameters, the length "AL2" (AL2>AL1, as FIG. 5 shows) of the second arm 12 can be represented by the following Formula (2):

$$AL2 = R2 + L2 + R3$$

As illustrated in FIG. 5, the second leading end of the second arm 12 is positioned at LF, and there is a first allowance distance of S1 (having a magnitude of S1) between LF and the restricted position P1. Also, there is a second allowance distance of S2 (having a magnitude of "S2") between the position LB of the first leading end of the first arm 11 and L52, which is the position of the inner surface of the second side wall 52.

Using the depth D (see FIG. 4), the first distance D1 (see FIG. 4), the first allowance distance S1, and the second allowance distance S2, the length "AL2" of the second arm 12 can be represented by the following Formula (3):

$$AL2 = D - D1 - S1 - S2$$

Cancelling "AL2" in Formula (2) and Formula (3) results in the following Formula (4):

$$R2+L2+R3=D-D1-S1-S2$$

This shows that "R2", "L2", and "R3" can be determined to satisfy Formula (4).

In FIG. 5, R1>r1>R2>r2>R3. Another possible embodiment is that R1≥r1≥R2≥r2≥R3. While in FIG. 5 the D cut is located at the second leading end of the second arm 12, the D cut may be located at another portion such as the first leading end of the first arm 11, the second base end of the second arm 12, and the hand base end of the hand 13. In a possible embodiment where the D cut is located at the first leading end of the first arm 11 and the second base end of the second arm 12, the second axis A2 becomes closer to the position LB, making the link lengths L1 and L2 respectively longer than L1 and L2 illustrated in FIG. 5.

The hand 13 will be described. As illustrated in FIG. 5, the third axis A3, which is the turning axis of the hand 13, passes through the hand 13. As described above by referring to FIG. 3, the center line 13CL connects the third axis A3 and the reference position 13C to each other and indicates the orientation of the hand 13.

Thus, when the hand 13 is perpendicular to the first side wall 51 (see FIG. 1), the center line 13CL is approximately parallel to the Y axis illustrated in FIG. 5. The leading end of the substrate 100 held by the hand 13 is approximately at the position LB.

Figure 6:
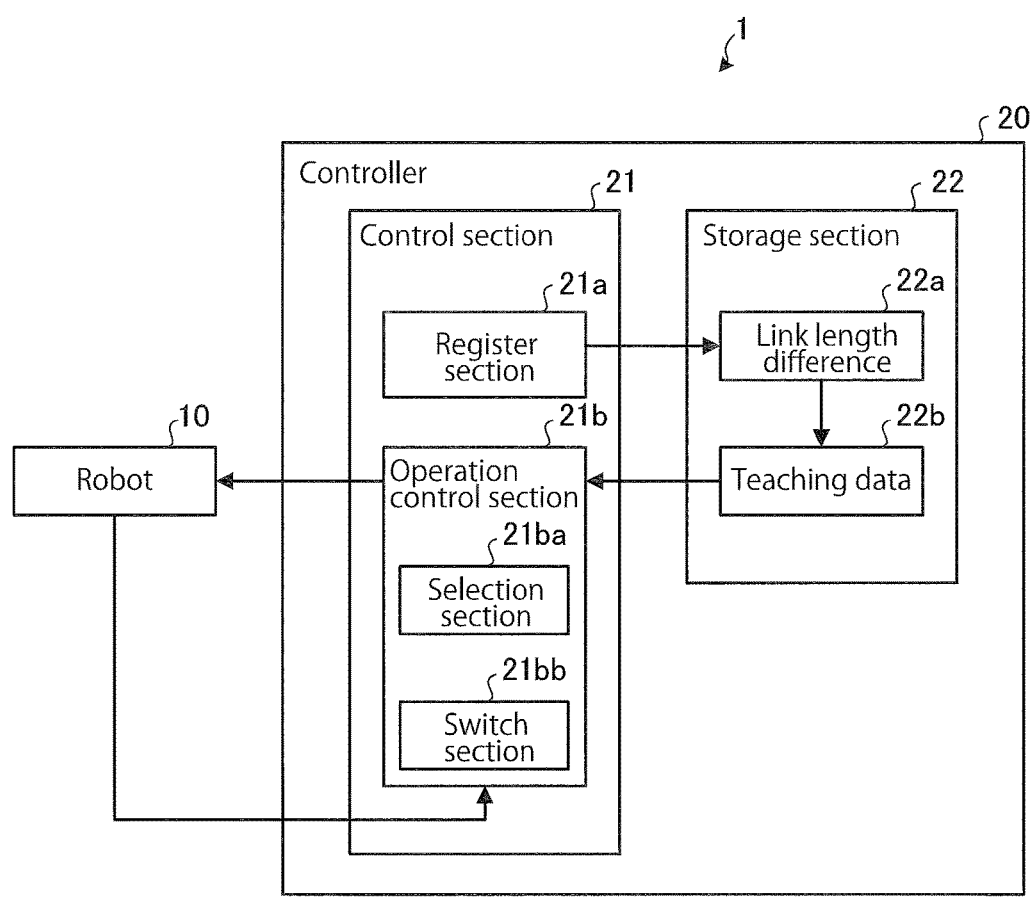
FIG. 6 is a block diagram of a controller.

By referring to FIG. 6, description will be made with regard to a controller 20, which controls the operation of the robot 10 (see FIG. 2). FIG. 6 is a block diagram of the controller 20. In FIG. 6, an input terminal device referred to as pendant and other related devices connected to the controller 20 are not illustrated.

While in FIG. 6 the robot 10 and the controller 20 are defined as the conveyance system 1, the robot 10 and the conveyance chamber 50 may be defined as the conveyance system 1, as illustrated in FIG. 1, or the robot 10, the controller 20, and the conveyance chamber 50 may be defined as the conveyance system 1.

As illustrated in FIG. 6, the controller 20 includes a control section 21 and a storage section 22. The control section 21 includes a register section 21a and an operation control section 21b. The operation control section 21b includes a selection section 21ba and a switch section 21bb. The storage section 22 stores a link length difference 22a and teaching data 22b. The controller 20 is connected to the robot 10.

The controller 20 includes a computer and various circuits. The computer includes CPU (Central Processing Unit), ROM (Read Only Memory), RAM (Random Access Memory), HDD (Hard Disk Drive), and an input/output port.

The CPU of the computer reads programs stored in the ROM and executes the programs, and thus functions as the register section 21a and the operation control section 21b of the control section 21.

Alternatively, at least one or both of the register section 21a and the operation control section 21b of the control section 21 may be made up of hardware such as ASIC (Application Specific Integrated Circuit) and FPGA (Field Programmable Gate Array). Also, at least one or both of the selection section 21ba and the switch section 21bb of the operation control section 21b may be made up of the above-described hardware.

The storage section 22 corresponds to the RAM and the HDD. The RAM and the HDD are capable of storing the link length difference 22a and the teaching data 22b. In another possible embodiment, the controller 20 may obtain the above-described programs and the various kinds of information from another computer connected to the controller 20 through a wired or wireless network or from a portable recording medium.

The control section 21 of the controller 20 controls the operation of the robot 10 based on the teaching data 22b in which the link length difference 22a is reflected. The register section 21a obtains the difference between the first link length L1, which is the inter-axis distance of the first arm 11 illustrated in FIG. 5, and the second link length L2, which is the inter-axis distance of the second arm 12 illustrated in FIG. 5, and causes the storage section 22 to store the difference as the link length difference 22a.

As described above by referring to FIG. 5, the second link length L2 is greater than the first link length L1. The link length difference 22a, therefore, is a piece of data corresponding to the value obtained by subtracting the first link length L1 from the second link length L2. How the link length difference 22a is used will be described in detail later by referring to FIGS. 8A and 8B.

The operation control section 21b controls the operation of the robot 10 based on the teaching data 22b in which the link length difference 22a is reflected. Specifically, in order to control the robot 10 to convey a substrate 100, the operation control section 21b generates a command based on the teaching data 22b stored in the storage section 22 and sends the command to the actuators (not illustrated) of the axes of the robot 10. Also, in order to improve the accuracy of the operation of the robot 10, the operation control section 21b performs, for example, feedback control using encoder values from the actuators.

The selection section 21ba determines whether a substrate 100 can be conveyed to a destination along a linear track in a top view of the robot 10 and the destination. When the selection section 21ba has determined that the substrate 100 can be conveyed to the destination along a linear track, the selection section 21ba selects one type of control that moves the hand 13 along the track (this control will be hereinafter referred to as "cylindrical coordinates control").

Assume that the first link length L1 and the second link length L2 are equal to each other (hereinafter referred to as "equal length links"). In this case, the cylindrical coordinates control moves the hand 13 radially from the first axis A1. The radial movement enables best use of the rotational speed of the actuator of each turning axis, resulting in expedited conveyance of the substrates 100, in other words, increased substrate conveyance throughputs.

In this embodiment, the second link length L2 is greater than the first link length L1. Even though the second link length L2 is greater than the first link length L1, the hand 13 moves along a tangent on a circle that is centered about the first axis A1 and that has a radius of "second link length L2−first link length L1". From the standpoint of the amount by which each axis turns, this movement is equivalent to the radial movement of the hand 13 from the first axis A1 in the case of the equal length links. This is because the hand 13 of the robot 10 is at a position away from the hand 13 in the case of the equal length links by the above-described radius.

When the selection section 21ba has determined that the substrate 100 cannot be conveyed to the destination along a linear track, the selection section 21ba selects another type of control that moves the hand 13 while changing the direction of the track on the way to the destination (this control will be hereinafter referred to as "orthogonal coordinates control").

When the switch section 21bb receives a new selection result different from the previous selection result from the selection section 21ba, the switch section 21bb switches from the cylindrical coordinates control to the orthogonal coordinates control or from the orthogonal coordinates control to the cylindrical coordinates control.

When the operation control section 21b performs the cylindrical coordinates control, the operation control section 21b controls the movement of the robot 10 to make the track of the hand 13 overlap a tangent on a circle that is centered about the first axis A1 (see FIG. 2) of the robot 10 and that has a radius equal to the link length difference 22a. This control will be described in detail later by referring to FIGS. 8A and 8B.

The teaching data 22b is information containing a "job" that is a program specifying an operation of the robot 10 including the movement track of the hand 13. The job is generated on the teaching stage, which is when the robot 10 is taught how to operate. In another possible embodiment, the teaching data 22b may be generated on another computer connected to the controller 20 through a wire or a wireless network and then may be stored in the storage section 22.

The link length difference 22a is reflected in the teaching data 22b as a parameter value. While in FIG. 6 the register section 21a of the control section 21 causes the link length difference 22a to be stored in the storage section 22, the teaching data 22b in which the link length difference 22a is reflected may be obtained through the above-described network and stored in the storage section 22.

Figure 7:
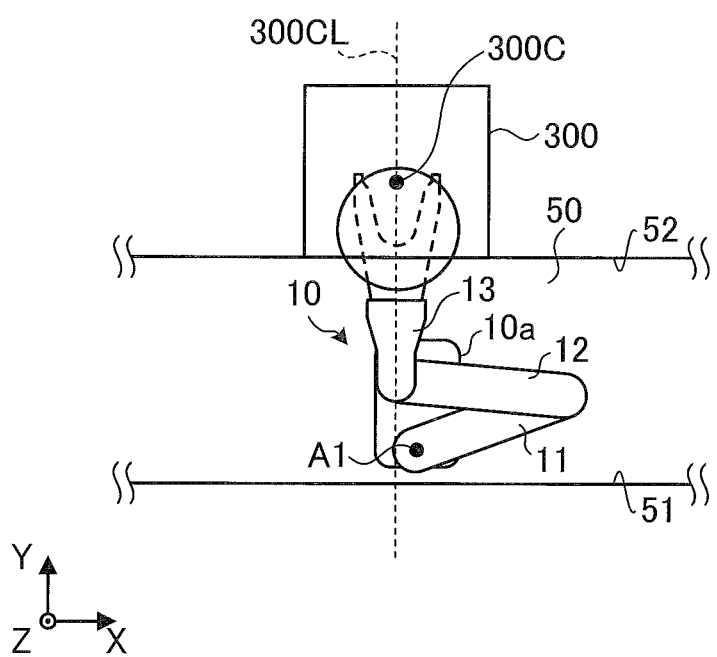
FIG. 7 is a top view of the robot illustrating shift-arrangement of the robot.

By referring to FIG. 7, a relationship in a top view of the position of the robot 10 and the position of the destination will be described. FIG. 7 is a top view of the robot 10 illustrating shifting of the robot 10. In FIG. 7, the robot 10 is placed at a position in front of or in the vicinity of the front surface of the processing chamber 300, which is located on the second side wall 52.

Also in FIG. 7, 300CL is a center line indicating the front surface of the processing chamber 300. The center line 300CL is a straight line passing through a conveyance position 300C of the processing chamber 300 and perpendicular to the second side wall 52. Also in FIG. 7, the cassettes 400 (see FIG. 1) on the first side wall 51 are not illustrated.

Assume that the second link length L2 of the second arm 12 and the first link length L1 of the first arm 11 of the robot 10 are equal to each other. In this case, if the body 10a is placed so that the first axis A1, which is the turning axis of the first arm 11, is located on the center line 300CL, substrates 100 can be conveyed to the processing chamber 300 by the cylindrical coordinates control.

In this embodiment, however, the second link length L2 of the second aim 12 is greater than the first link length L1 of the first arm 11 of the robot 10, as described above by referring to FIGS. 4 to 6. In light of this situation, in order to convey substrates 100 to the processing chamber 300 by the cylindrical coordinates control, this embodiment shifts the first axis A1 from the center line 300CL by the link length difference 22a (the second link length L2−the first link length L1).

In other words, the center line 300CL of the processing chamber 300 may be shifted from the front surface (straight line passing through the first axis A1 and approximately parallel to the Y axis illustrated in FIG. 7) of the robot 10 by the link length difference 22a. In the following description, the shifting of the robot 10 and the destination such as the processing chamber 300 relative to each other by the link length difference 22a will be referred to as "shift-arrangement" or "shift-arranged".

While in FIG. 1 the robot 10 is placed between a cassette 200 and a cassette 200, the robot 10 may be placed on or in the vicinity of the front surface of a cassette 200. In this case, the robot 10 and the facing cassette 200 may be shift-arranged, similarly to the case of the processing chamber 300 illustrated in FIG. 7.

While in FIG. 1 four cassettes 200 are aligned along the first side wall 51, an odd number of cassettes 200, such as one cassette 200, three cassettes 200, and five cassettes 200, may be aligned along the first side wall 51. In this case, the robot 10 may be shift-arranged on or in the vicinity of the front surface of the center cassette 200 of the aligned cassettes 200.

In FIG. 7, the first axis A1 of the robot 10 is shifted from the center line 300CL of the processing chamber 300 in the X axis positive direction. This is because the robot 10 is taking such a posture that the portion of connection between the first arm 11 and the second arm 12 protrudes in the X axis positive direction. When the robot 10 approaches the processing chamber 300 while taking such a posture that the portion of connection protrudes in the X axis negative direction, which is opposite to the X axis (positive) direction, the first axis A1 of the robot 10 may be shifted from the center line 300CL in the X axis negative direction.

When in FIG. 1 the robot 10 is taking the posture illustrated in FIG. 7, the cassettes 400 (see FIG. 1) on the first side wall 51 may be arranged so that the conveyance position 200C is located on the center line 300CL illustrated in FIG. 7.

When in FIG. 1 the robot 10 is taking such a posture that the portion of connection between the first arm 11 and the second arm 12 protrudes in the X axis negative direction, the first axis A1 of the robot 10 may be shifted from the center line 300CL in the X axis negative direction.

Thus, the robot 10 is shift-arranged relative to the destination such as the cassettes 200 and the processing chamber 300. The shift-arrangement provides more opportunities to perform the cylindrical coordinates control in the operation control of the robot 10, resulting in expedited conveyance of the substrates 100.

Figure 8A:
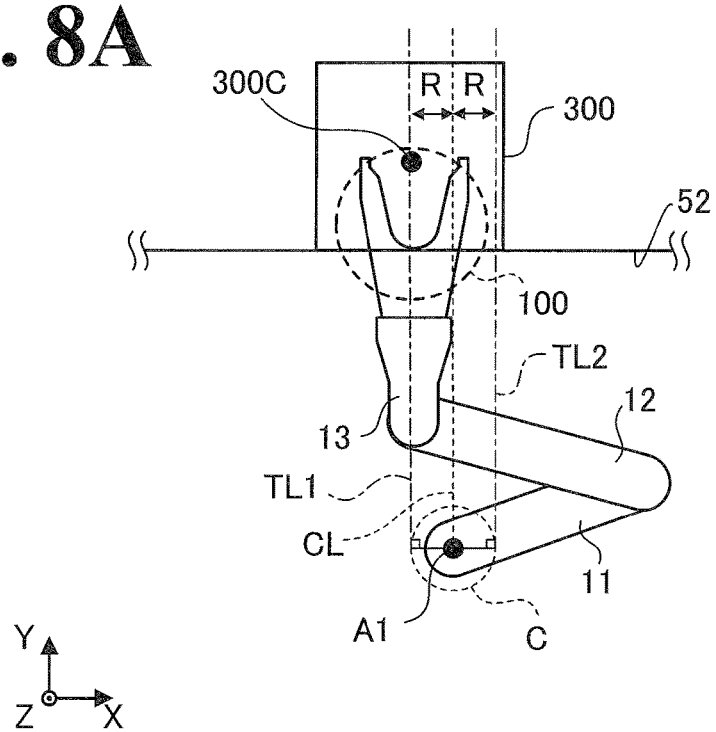
FIG. 8A illustrates a conveyance operation to a destination located on a second side wall.
Figure 8B:
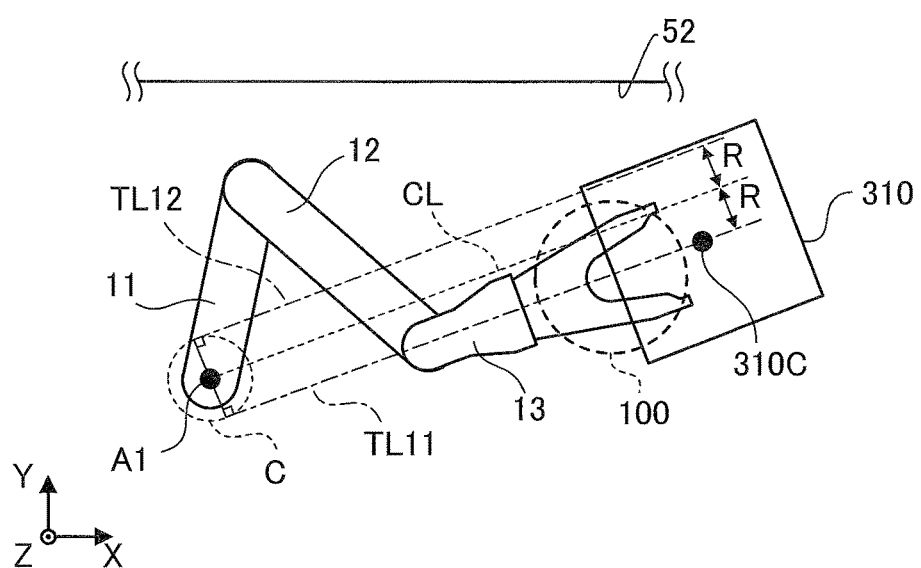
FIG. 8B illustrates a conveyance operation to a destination located in the conveyance chamber.

Thus, the shift-arrangement of the robot 10 relative to the destination such as the cassettes 200 and the processing chamber 300 has been described by referring to FIG. 7. Next, by referring to FIGS. 8A and 8B, description will be made with regard to details of the control performed by the operation control section 21b in the case of the shift-arrangement being performed. FIG. 8A illustrates a conveyance operation to a destination located on the second side wall 52. FIG. 8B illustrates a conveyance operation to a destination located in the conveyance chamber 50.

As illustrated in FIGS. 8A and 8B, C is a circle that is centered about the first axis A1 and that has a radius of R. The radius R is equal to the link length difference 22a (see FIG. 6), that is, equal to the value obtained by subtracting a first link length L1 (see FIG. 5) from a second link length L2 (see FIG. 5). Also as illustrated in FIGS. 8A and 8B, CL is a center line indicating, for reference purposes, the track that the hand 13 would draw if the second link length L2 were equal to the first link length L1.

A conveyance operation to a destination located on the second side wall 52 will be described by referring to FIG. 8A. As illustrated in FIG. 8A, when the robot 10 conveys a substrate 100 to the processing chamber 300 while taking the posture illustrated in FIG. 7, the robot 10 moves the hand 13 straight along a tangent TL1. The tangent TL1 is one of tangents TL1 and TL2 on the circle C. The tangents TL1 and TL2 are approximately parallel to the center line CL. The conveyance position 300C of the processing chamber 300 is located on the tangent TL1.

The hand 13 moves straight along the tangent TL1 with the center line 13CL (see FIG. 3) matching the tangent TL1, that is, without turning the substrates 100, so as to convey the substrate 100 to the conveyance position 300C. When the hand 13 takes the substrate 100 at the conveyance position 300C out of the processing chamber 300, the hand 13 inversely follows the track that the hand 13 takes to convey the substrate 100 to the processing chamber 300.

When the conveyance position 300C of the processing chamber 300 is located on the tangent TL2, the robot 10 takes such a posture that the portion of connection between the first arm 11 and the second arm 12 protrudes in the X axis negative direction. Then, the robot 10 moves the hand 13 along the tangent TL2.

A conveyance operation to a destination located in the conveyance chamber 50 will be described by referring to FIG. 8B. In FIG. 8B, the destination is the aligner 310, which is located in the conveyance chamber 50.

As illustrated in FIG. 8B, when the robot 10 conveys a substrate 100 to the aligner 310 while taking such a posture that the portion of connection between the first arm 11 and the second arm 12 protrudes in the Y axis positive direction, the robot 10 moves the hand 13 straight along a tangent TL11. The tangent TL11 is one of tangents TL11 and TL12 on the circle C. The tangents TL11 and TL12 are approximately parallel to the center line CL. The conveyance position, 310C, of the aligner 310 is located on the tangent TL11.

The hand 13 moves straight along the tangent TL11 with the center line 13CL (see FIG. 3) matching the tangent TL11, that is, without turning the substrates 100, so as to convey the substrate 100 to the conveyance position 310C. When the hand 13 takes the substrate 100 from the conveyance position 310C, the hand 13 inversely follows the track that the hand 13 takes to convey the substrate 100 to the aligner 310.

When the conveyance position 310C of the aligner 310 is located on the tangent TL12, the robot 10 takes such a posture that the portion of connection between the first arm 11 and the second arm 12 protrudes in the Y axis negative direction. Then, the robot 10 moves the hand 13 along the tangent TL12.

While in FIGS. 8A and 8B the destinations are the processing chamber 300 and the aligner 310, these embodiments should not be construed as limiting the destination. Other examples of the destination include, but are not limited to, the cassettes 200 (see FIG. 1) and a space for temporary storage of the substrates 100.

While in FIG. 8A the processing chamber 300 is located on the second side wall 52, the processing chamber 300 may be located on a shorter side of the conveyance chamber 50 illustrated in FIG. 1 or beside the shorter side of the conveyance chamber 50. While in FIG. 8A the center line CL is approximately perpendicular to the second side wall 52, the center line CL may not necessarily be perpendicular to the second side wall 52 insofar as the movement path of a substrate 100 (the track of the hand 13) is based on each different processing chamber 300.

Figure 9A:
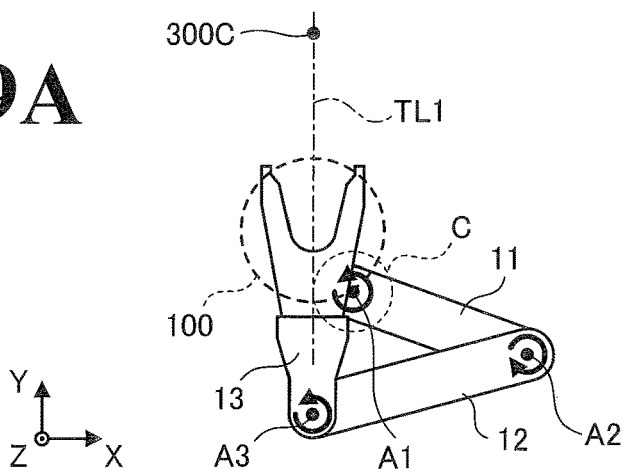
FIG. 9A is a first illustration of how the robot moves in a conveyance operation.
Figure 9B:
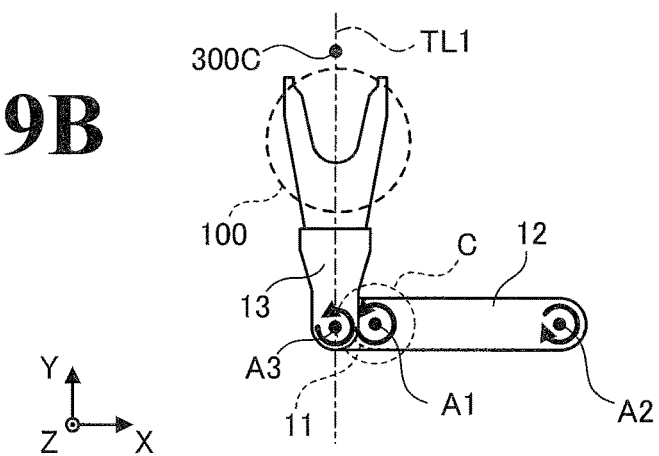
FIG. 9B is a second illustration of how the robot moves in the conveyance operation.
Figure 9C:
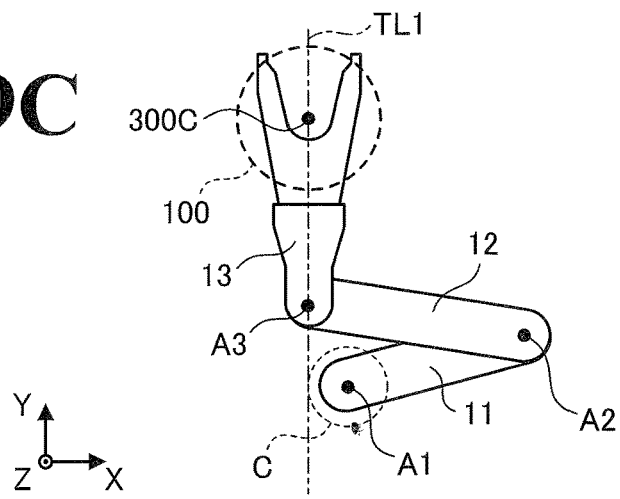
FIG. 9C is a third illustration of how the robot moves in the conveyance operation.

By referring to FIGS. 9A to 9C, how the robot 10 moves in a conveyance operation will be described. FIGS. 9A to 9C are first to third illustrations of how the robot 10 moves in a conveyance operation. In FIGS. 9A to 9C, the conveyance of the substrate 100 to the conveyance position 300C of the processing chamber 300 illustrated in FIG. 8A is taken as an example, with indications of the directions of turning of the first axis A1, the second axis A2, and the third axis A3.

Along the tangent TL1, which passes through the conveyance position 300C, the robot 10 moves the hand 13 in a straight manner, that is, without changing the posture of the hand 13, so as to convey the substrate 100 to the conveyance position 300C. As described above, the tangent TL1 is one of the tangents on the circle C.

As illustrated in FIG. 9A, the robot 10 takes such a posture that the center line 13CL (see FIG. 3) of the hand 13 matches the tangent TL1. Then, as illustrated in FIG. 9A, the robot 10 turns the first axis A1 anti-clockwise, turns the second axis A2 clockwise, and turns the third axis A3 anti-clockwise in harmonization.

This causes the hand 13 to move along the tangent TL1 to the conveyance position 300C in a straight manner, that is, without changing the posture of the hand 13. Then, as illustrated in FIG. 9B, the robot 10 comes to take such a posture that the first arm 11 and the second arm 12 overlap each other.

As illustrated in FIG. 9B, the robot 10 turns the first axis A1 anti-clockwise, turns the second axis A2 clockwise, and turns the third axis A3 anti-clockwise in harmonization, similarly to FIG. 9A. This causes the hand 13 to move along the tangent TL1 in a straight manner, that is, without changing the posture of the hand 13, and causes the substrate 100 to reach the conveyance position 300C, as illustrated in FIG. 9C.

As illustrated in FIGS. 9A to 9C, when the hand 13 moves along the tangent TL1 to approach the conveyance position 300C, the first axis A1 is turned in a fixed direction (anti-clockwise, as illustrated in FIGS. 9A and 9B). That is, the turning direction of the first axis A1 is not changed on the way to the conveyance position 300C.

This configuration eliminates the need for deceleration that would otherwise be necessitated by the change of the turning direction. As a result, the conveyance of the substrates 100 is expedited and performed more accurately. Also in the above configuration, the amount by which the first arm 11 moves is smaller than when the turning direction is changed on the way to the conveyance position 300C. As a result, the conveyance of the substrates 100 is expedited and performed more accurately.

As illustrated in FIGS. 9A to 9C, the turning direction of the second axis A2 is also fixed (clockwise, as illustrated in FIGS. 9A and 9B), and the turning direction of the third axis A3 is also fixed (anti-clockwise, as illustrated in FIGS. 9A and 9C). Thus, the turning directions of the second axis A2 and the third axis A3 are not changed on the way to the conveyance position 300C, resulting in advantageous effects similar to the advantageous effects described above with regard to the first axis A1.

When the robot 10 moves the hand 13 away from the conveyance position 300C along the tangent TL1, the order of movement may be FIG. 9C, FIG. 9B, and FIG. 9A. In this case, the turning directions of the first axis A1, the second axis A2, and the third axis A3 are respectively opposite to the turning directions illustrated in FIGS. 9A and 9B. Specifically, the turning direction of the first axis A1 is clockwise, the turning direction of the second axis A2 is anti-clockwise, and the turning direction of the third axis A3 is clockwise.

In FIGS. 9A to 9C, in order to convey a substrate 100, the robot 10 moves the hand 13 along the tangent TL1, that is, the robot 10 takes such a posture that the portion of connection between the first arm 11 and the second arm 12 protrudes in the X axis positive direction. In another possible embodiment, the robot 10 may move the hand 13 along the tangent TL2 (see FIG. 8A), that is, the robot 10 may take such a posture that the portion of connection protrudes in the X axis negative direction, so as to convey a substrate 100. In this case, the turning directions of the first axis A1, the second axis A2, and the third axis A3 illustrated in FIGS. 9A to 9C are reversed.

Figure 10:
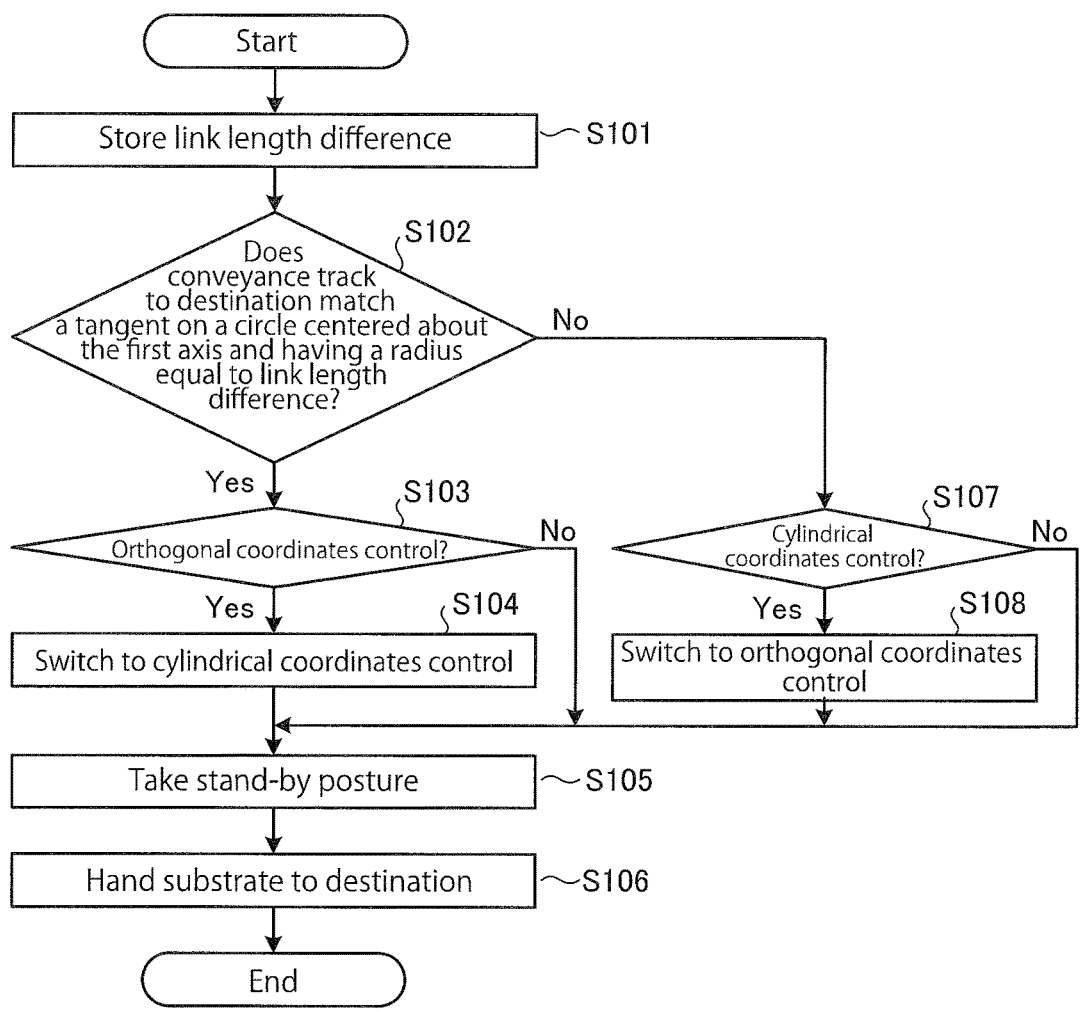
FIG. 10 is a flowchart of a procedure for the conveyance operation performed by the conveyance system.

Next, a procedure for a conveyance operation performed by the conveyance system 1 (see FIG. 1) will be described by referring to FIG. 10. FIG. 10 is a flowchart of a procedure for the conveyance operation performed by the conveyance system 1. The following description refers to the components the controller 20 illustrated in FIG. 6.

As illustrated in FIG. 10, the register section 21*a* causes the link length difference 22*a* to be stored in the storage section 22 (step S101). The selection section 21*ba* of the operation control section 21*b* determines whether the conveyance track to the destination matches a tangent on a circle that is centered about the first axis A1 and that has a radius equal to the link length difference 22*a* (step S102).

When at step S102 the selection section 21*ba* has determined that the conveyance track to the destination matches the tangent (Yes at step S102), the switch section 21*bb* of the operation control section 21*b* determines whether the current control is the orthogonal coordinates control (step S103). When the current control is the orthogonal coordinates control (Yes at step S103), the orthogonal coordinates control is switched to the cylindrical coordinates control (step S104). When the current control is the cylindrical coordinates control (No at step S103), step S104 is skipped to step S105.

Next, the operation control section 21*b* controls the robot 10 to take a stand-by posture relative to the destination (step S105). Then, the operation control section 21*b* controls the robot 10 to move to the destination and hand the substrate 100 to the destination (step S106). Thus, the conveyance operation ends. In the case of the cylindrical coordinates control, the operation control section 21*b* controls the robot 10 to convey the substrate 100 along a tangent on the circle C (see FIG. 8A), as described above by referring to FIG. 8A and other drawings.

When at step S102 the selection section 21*ba* has determined that the conveyance track to the destination does not match the tangent (No at step S102), the switch section 21*bb* of the operation control section 21*b* determines whether the current control is the cylindrical coordinates control (step S107). When the current control is the cylindrical coordinates control (Yes at step S107), the cylindrical coordinates control is switched to the orthogonal coordinates control (step S108), and the conveyance operation proceeds to step S105. When the current control is the orthogonal coordinates control (No at step S107), step S108 is skipped to step S105.

Figure 11:
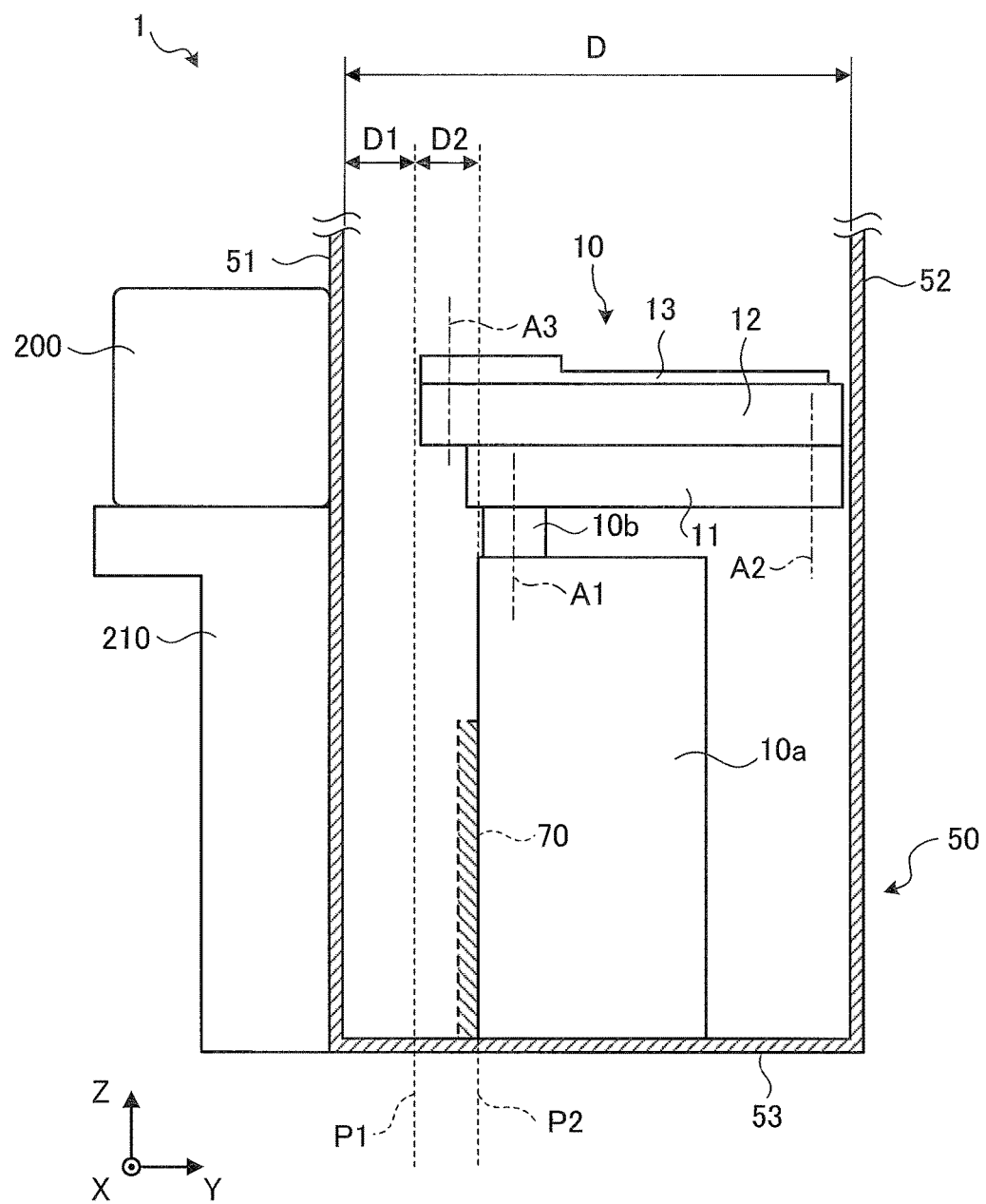
FIG. 11 is a side view of the conveyance system with the robot placed on a bottom.

While in the embodiment of FIG. 4 the robot 10 is hung on and fixed to the reference plate 60, the robot 10 may be placed on the bottom 53 of the conveyance chamber 50. An embodiment in which the robot 10 is placed on the bottom 53 of the conveyance chamber 50 will be described by referring to FIG. 11. FIG. 11 is a side view of the robot 10 of the conveyance system 1 with the robot 10 placed on the bottom 53 of the conveyance chamber 50. Like reference numerals designate corresponding or identical elements throughout FIG. 11 and FIG. 4, and those elements described above by referring to FIG. 4 will not be elaborated or will be mentioned simply.

As illustrated in FIG. 11, the body 10*a* of the robot 10 is placed on and fixed to the bottom 53 of the conveyance chamber 50. Specifically, the body 10*a* is located at the reference position P2 as a result of the body 10*a* being brought into contact with the reference position P2 from the side of the second side wall 52. In other words, the body 10*a* is located on the side of the second side wall 52 relative to the reference position P2. The body 10*a* is fixed to the bottom 53 with bolts or other fasteners.

An aid member 70, which is shaded in FIG. 11, is located on the first side wall 51 side of the reference position P2. The aid member 70 is fixed to the bottom 53 with bolts or other fasteners and aids the fixation of the robot 10. The robot 10 is fixed to the aid member 70 with bolts or other fasteners with the reference position P2 side surface of the robot 10 being in contact with a side surface of the body 10*a*.

The use of the aid member 70 more reliably prevents the wobbling of the body 10*a* while the robot 10 is in operation. While in FIG. 11 the aid member 70 is located on the first side wall 51 side of the robot 10, the aid member 70 may be located on the second side wall 52 side of the robot 10, on the X axis positive direction side of the robot 10, or on the X axis negative direction side of the robot 10. It is also possible to eliminate the aid member 70 itself.

Insofar as the aid member 70 is capable of preventing the wobbling of the body 10*a*, the shape of the aid member 70 may be other than the shape illustrated in FIG. 11. Other examples of the shape of the aid member 70 include, but are not limited to, a rectangular parallelepiped shape and a cubic shape. It is also possible to use a plurality of aid members 70 to fix side surfaces of the body 10*a*.

Figure 12:
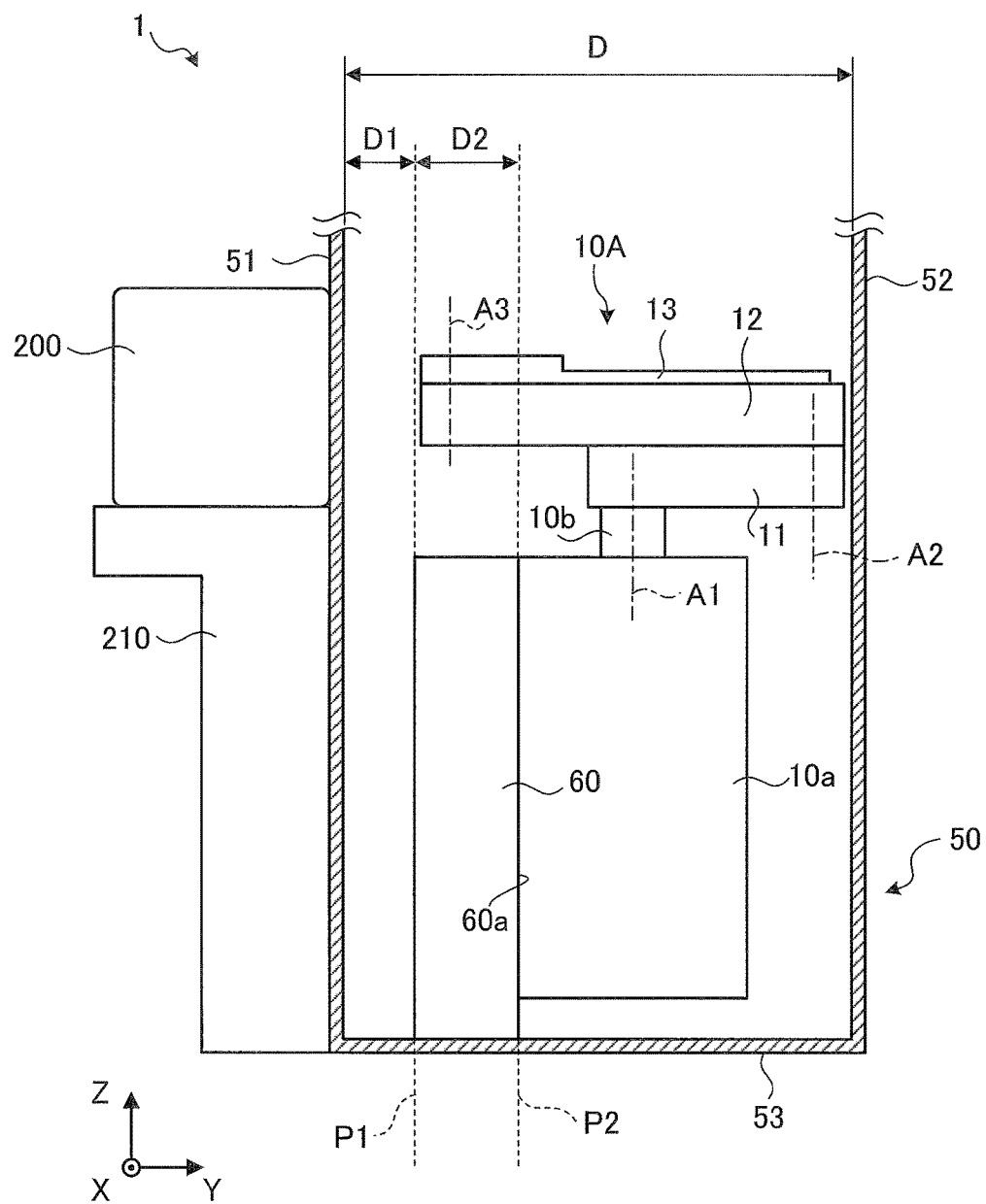
FIG. 12 is a side view of the conveyance system illustrating a modification of arrangement of the robot.

By referring to FIG. 12, a modification of arrangement of the robot 10 will be described. FIG. 12 is a side view of the conveyance system 1 illustrating a modification of arrangement of the robot 10. FIG. 12 is different from FIG. 4 in that the first axis A1 is closer to the second side wall 52 in FIG. 12 than in FIG. 4. Because of the difference, the length of the first arm 11 of the robot 10 illustrated in FIG. 12 is shorter than the length of the first arm 11 of the robot 10 illustrated in FIG. 4. Like reference numerals designate corresponding or identical elements throughout FIG. 12 and FIG. 4, and those elements described above by referring to FIG. 4 will not be elaborated or will be mentioned simply.

As illustrated in FIG. 12, the first axis A1 is located at a position obtained by subtracting the first distance D1 from the depth D of the conveyance chamber 50 and by dividing the obtained distance by two. Because of the position of the first axis A1, the first link length L1 of the first arm 11 is approximately half the second link length L2 of the second arm 12. Also as illustrated in FIG. 12, the first base end of the first arm 11 is closer to the second side wall 52 than the reference position P2 is to the second side wall 52. In the embodiment FIG. 12, the first min 11 is capable of making more than one full rotation about the first axis A1. The embodiment of FIG. 12 is otherwise similar to the embodiment of FIG. 4.

As has been described hereinbefore, the conveyance system 1 according to this embodiment includes the conveyance chamber 50 and the robot 10. The conveyance chamber 50 includes the first side wall 51 and the second side wall 52. On the first side wall 51, the cassettes 200 are disposed. The cassettes 200 contain the substrates 100. The second side wall 52 is opposed to the first side wall 51. The robot 10 is disposed in the conveyance chamber 50, and includes the body 10*a*, the first arm 11, the second arm 12, and the hand 13. The first base end of the first arm 11 is turnably connected to the body 10*a*. The second base end of the second arm 12 is turnably connected to the first leading end of the first arm 11. The hand base end of the hand 13 is turnably connected to the second leading end of the second arm 12. The hand 13 is configured to hold a substrate 100.

The conveyance chamber 50 includes the restricted position P1 and the reference position P2. The restricted position P1 is located at the first distance D1 from the side of the first side wall 51 inside the conveyance chamber 50 toward the second side wall 52, and the robot 10 passing beyond the restricted position P1 is limited. The reference position P2 is located at the second distance D2 from the restricted position P1 toward the second side wall 52, and indicates the installment position at which the robot 10 is to be installed. The body 10a of the robot 10 is located on the side of the reference position P2 facing the second side wall 52. The inter-axis distance of the second arm 12 is longer than the inter-axis distance of the first arm 11. With the robot 10 taking such a normal posture that the first arm 11 and the second arm 12 overlap each other and are perpendicular to the first side wall 51, the second leading end of the second arm 12 is located between the restricted position P1 and the reference position P2.

With this configuration, the conveyance system 1 according to this embodiment makes the first arm 11 and the second arm 12 as long as possible without interference with the conveyance chamber 50, improving conveyance efficiency without increase in costs.

The method according to this embodiment for controlling the robot 10 uses the robot 10. The robot 10 includes the body 10a, the first arm 11, the second arm 12, and the hand 13. The first base end of the first arm 11 is turnably connected to the body 10a. The second base end of the second arm 12 is turnably connected to the first leading end of the first arm 11. The hand base end of the hand 13 is turnably connected to the second leading end of the second arm 12. The hand 13 is configured to hold a substrate 100. The inter-axis distance of the first arm 11 and the inter-axis distance of the second arm 12 are different from each other.

The method includes: controlling the robot 10 to store the difference between the inter-axis distance of the first arm 11 and the inter-axis distance of the second arm 12 as the link length difference 22a; and controlling the robot 10 to convey the substrate 100 along a tangent on the circle C, which is centered about the turning axis of the first arm 11 (the first axis A1) and which has a radius equal to the link length difference 22a.

With this configuration, the method according to this embodiment for controlling the robot 10 enables best use of the rotational speeds of the first aim 11, the second arm 12, and the hand 13, resulting in expedited conveyance of the substrates 100. In other words, the method according to this embodiment for controlling the robot 10 increases substrate conveyance throughputs.

Obviously, numerous modifications and variations of the present disclosure are possible in light of the above teachings. It is therefore to be understood that within the scope of the appended claims, the present disclosure may be practiced otherwise than as specifically described herein.

What is claimed is:

1. A conveyance system comprising:
   a conveyance chamber comprising:
      a first side wall, at least one cassette to contain at least one substrate being disposed on a side of the first side wall outside of the conveyance chamber; and
      a second side wall opposite to the first side wall in a depth direction of the conveyance chamber;
   a robot disposed in the conveyance chamber and comprising:
      a body disposed between the second side wall and a reference position in the depth direction;
      a first arm comprising:
         a first base end connected to the body rotatably around a first rotation axis; and
         a first leading end opposite to the first base end;
      a second arm comprising:
         a second base end connected to the first leading end of the first arm rotatably around a second rotation axis, the first arm having a first inter-axis distance between the first rotational axis and the second rotational axis in a first inter-axis direction; and
         a second leading end opposite to the second base end; and
      a hand to hold the substrate, comprising:
         a hand base end connected to the second leading end of the second arm rotatably around a third rotation axis, the second arm having a second inter-axis distance between the second rotation axis and the third rotation axis in a second inter-axis direction, the second inter-axis distance being longer than the first inter-axis distance, the second leading end being positioned between a restricted position and the reference position in the depth direction when the first inter-axis direction and the second inter-axis direction are substantially perpendicular to the first side wall; and
   a controller connected to the robot to control the robot to limit entrance into an area between the first side wall and the restricted position in the depth direction; wherein the second arm comprises a first curved side surface provided at the second leading end and viewed in a view direction directed toward the second rotation axis via the third rotation axis along the second inter-axis direction, a plane surface provided at the second leading end, and a second curved side surface which is provided at the second leading end, the second curved side surface and the first curved side surface being provided on opposite ends of the plane surface, wherein the plane surface is substantially parallel to the third rotation axis, wherein the plane surface connects the first curved side surface and the second curved side surface, and wherein the plane surface of the second arm is tangent to the hand base end of the hand viewed in a direction along the third rotation axis when the first inter-axis direction and the second inter-axis direction are substantially perpendicular to the first side wall.

2. The conveyance system according to claim 1, wherein a second distance between the restricted position and the reference position in the depth direction is smaller than a first distance between the first side wall and the restricted position in the depth direction.

3. The conveyance system according to claim 2, wherein the first base end of the first arm is located between the restricted position and the reference position in the depth direction.

4. The conveyance system according to claim 2, further comprising a reference plate located at the reference position and comprising a reference surface on which the robot is mounted such that a side surface of the body is mounted on the reference plate.

5. The conveyance system according to claim 1, wherein the first base end of the first arm is located between the restricted position and the reference position in the depth direction.

6. The conveyance system according to claim 5, further comprising a reference plate located at the reference position and comprising a reference surface on which the robot is mounted such that a side surface of the body is mounted on the reference plate.

7. The conveyance system according to claim 1, further comprising a reference plate located at the reference position and comprising a reference surface on which the robot is mounted such that a side surface of the body is mounted on the reference plate.

8. The conveyance system according to claim 1,
wherein the at least one cassette comprises four cassettes aligned with each other along the first side wall, and
wherein the robot is configured to move the hand holding the substrate to a conveyance position of each of the four cassettes.

9. The conveyance system according to claim 1, wherein a difference between the second inter-axis distance of the second arm and the first inter-axis distance of the first arm is defined as a link length difference, and wherein a destination to which the substrate is to be conveyed is located on a tangent on a circle having a center at the first rotation axis and having a radius approximately equal to the link length difference.

10. The conveyance system according to claim 9, wherein the controller is configured to control the robot to convey the substrate along the tangent.

11. The conveyance system according to claim 10, wherein the controller is configured to control the first arm to turn in one direction to convey the substrate in a direction along the tangent.

12. The conveyance system according to claim 1, wherein the second rotation axis is substantially parallel to the first rotation axis, and wherein the third rotation axis is substantially parallel to the second rotation axis.

13. The conveyance system according to claim 1, wherein the area between the first side wall and the restricted position is room for the at least one cassette to be opened and closed.

14. A robot comprising:
a body disposed between a second side wall and a reference position in a depth direction of a conveyance chamber, the second side wall being opposite to a first side wall, at least one cassette to contain at least one substrate being disposed on a side of the first side wall outside of the conveyance chamber;
a first arm comprising:
a first base end connected to the body rotatably around a first rotation axis; and
a first leading end opposite to the first base end;
a second arm comprising:
a second base end connected to the first leading end of the first arm rotatably around a second rotation axis, the first arm having a first inter-axis distance between the first rotational axis and the second rotational axis in a first inter-axis direction; and
a second leading end opposite to the second base end;
a hand to hold the substrate, comprising:
a hand base end connected to the second leading end of the second arm rotatably around a third rotation axis, the second arm having a second inter-axis distance between the second rotation axis and the third rotation axis in a second inter-axis direction, the second inter-axis distance being longer than the first inter-axis distance, the second leading end being positioned between a restricted position and the reference position in the depth direction when the first inter-axis direction and the second inter-axis direction are substantially perpendicular to the first side wall, the robot being controlled by a controller connected to the robot to limit entrance into an area between the first side wall and the restricted position in the depth direction;
wherein the second arm comprises a first curved side surface provided at the second leading end and viewed in a view direction directed toward the second rotation axis via the third rotation axis along the second inter-axis direction, a plane surface provided at the second leading end, and a second curved side surface which is provided at the second leading end, the second curved side surface and the first curved side surface being provided on opposite ends of the plane surface, wherein the plane surface is substantially parallel to the third rotation axis, wherein the plane surface connects the first curved side surface and the second curved side surface, and wherein the plane surface of the second arm is tangent to the hand base end of the hand viewed in a direction along the third rotation axis when the first inter-axis direction and the second inter-axis direction are substantially perpendicular to the first side wall.

15. The robot according to claim 14, wherein the second rotation axis is substantially parallel to the first rotation axis, and wherein the third rotation axis is substantially parallel to the second rotation axis.

16. The robot according to claim 14, wherein the area between the first side wall and the restricted position is room for the at least one cassette to be opened and closed.

* * * * *